(12) United States Patent
Lentz

(10) Patent No.: US 9,087,419 B2
(45) Date of Patent: *Jul. 21, 2015

(54) METHOD AND APPARATUS FOR REMOTE E-ENABLED AIRCRAFT SOLUTION MANAGEMENT USING AN ELECTRONIC FLIGHT BAG (EFB)

(71) Applicant: ARINC INCORPORATED, Annapolis, MD (US)

(72) Inventor: Robert Lewis Lentz, Pasadena, MD (US)

(73) Assignee: ARINC Incorporated, Annapolis, MD (US)

( * ) Notice: Subject to any disclaimer, the term of this patent is extended or adjusted under 35 U.S.C. 154(b) by 22 days.

This patent is subject to a terminal disclaimer.

(21) Appl. No.: 13/676,885

(22) Filed: Nov. 14, 2012

(65) Prior Publication Data
US 2013/0124034 A1    May 16, 2013

Related U.S. Application Data

(60) Provisional application No. 61/559,349, filed on Nov. 14, 2011.

(51) Int. Cl.
| | | |
|---|---|---|
| G07C 5/00 | (2006.01) | |
| G06F 17/00 | (2006.01) | |
| B64F 5/00 | (2006.01) | |
| G01M 17/00 | (2006.01) | |
| G07C 5/08 | (2006.01) | |
| G01R 31/00 | (2006.01) | |

(52) U.S. Cl.
CPC .............. *G07C 5/008* (2013.01); *B64F 5/0045* (2013.01); *G01M 17/00* (2013.01); *G01R 31/008* (2013.01); *G07C 5/006* (2013.01); *G07C 5/0808* (2013.01)

(58) Field of Classification Search
USPC .......... 701/3, 31.4–31.9; 244/99.4, 99.9, 220, 244/221; 340/3.1, 945
See application file for complete search history.

(56) References Cited

U.S. PATENT DOCUMENTS

| | | | | |
|---|---|---|---|---|
| 5,974,349 | A * | 10/1999 | Levine | 701/29.6 |
| 6,173,159 | B1 * | 1/2001 | Wright et al. | 455/66.1 |
| 7,437,220 | B2 | 10/2008 | Stefani | |
| 7,636,568 | B2 * | 12/2009 | Gould et al. | 455/431 |
| 7,788,002 | B2 * | 8/2010 | Yukawa et al. | 701/31.4 |
| 8,255,112 | B2 * | 8/2012 | Conzachi et al. | 701/31.5 |
| 8,306,685 | B2 * | 11/2012 | Yukawa et al. | 701/31.4 |
| 8,335,601 | B2 * | 12/2012 | Sham et al. | 701/3 |
| 8,437,906 | B2 * | 5/2013 | Yukawa et al. | 701/29.1 |
| 2002/0165647 | A1 * | 11/2002 | Glenn et al. | 701/3 |

(Continued)

*Primary Examiner* — Thomas Tarcza
*Assistant Examiner* — Tyler J Lee
(74) *Attorney, Agent, or Firm* — Ronald E. Prass, Jr.; Prass LLP

(57) ABSTRACT

A method for using an Electronic Flight Bag (EFB) located on an aircraft to communicate with a remote aircraft system data communications unit concerning aircraft systems problems and malfunctions, is disclosed. The method may include receiving aircraft systems data from one or more aircraft systems, identifying any problems or malfunctions in the aircraft systems, automatically communicating any identified problems or malfunctions in the aircraft systems to the remote aircraft system data communications unit, receiving information concerning a solution to the identified problems or malfunctions in the aircraft systems from the remote aircraft system data communications unit, and implementing the solution to the identified problems or malfunctions in the aircraft systems.

16 Claims, 6 Drawing Sheets

(56) References Cited

U.S. PATENT DOCUMENTS

| | | |
|---|---|---|
| 2004/0106404 A1* | 6/2004 | Gould et al. .................. 455/431 |
| 2005/0228558 A1* | 10/2005 | Valette et al. .................. 701/33 |
| 2007/0016344 A1* | 1/2007 | Stefani .............................. 701/3 |
| 2007/0112489 A1* | 5/2007 | Avery et al. ..................... 701/35 |
| 2007/0115938 A1* | 5/2007 | Conzachi et al. .............. 370/352 |
| 2008/0159158 A1* | 7/2008 | Poisson et al. ................. 370/249 |
| 2010/0125468 A1* | 5/2010 | Avery et al. ......................... 705/7 |
| 2010/0152924 A1* | 6/2010 | Pandit et al. ....................... 701/3 |
| 2010/0161157 A1* | 6/2010 | Guilley et al. ..................... 701/3 |
| 2010/0292869 A1* | 11/2010 | Riley et al. ......................... 701/3 |
| 2011/0160937 A1* | 6/2011 | Caillaud et al. ................... 701/3 |

* cited by examiner

METHOD AND APPARATUS FOR REMOTE E-ENABLED AIRCRAFT SOLUTION MANAGEMENT USING AN ELECTRONIC FLIGHT BAG (EFB)

PRIORITY INFORMATION

This non-provisional application claims priority from U.S. Provisional Application Ser. No. 61/559,349, filed, Nov. 14, 2011, the content of which is incorporated herein by reference in its entirety.

BACKGROUND OF THE DISCLOSED EMBODIMENTS

1. Field of the Disclosed Embodiments

The disclosed embodiments relates to remote e-enabled aircraft solution management using an electronic flight bag (EFB).

2. Introduction

Aircraft avionics equipment present an issue as to how faults can be reported to the maintenance personnel on the ground. Typically in today's environment, the aircraft crew may notice an issue and write it up, but it is not until later that the maintenance personnel get any notification of the fault and are able to take any corrective action. If a process were available to provide information maintenance personnel in a more expeditious manner, the maintenance crew can more efficiently investigate the fault and provide an effective solution.

SUMMARY OF THE DISCLOSURE

A method for using an Electronic Flight Bag (EFB) located on an aircraft to communicate with a remote aircraft system data communications unit concerning aircraft systems problems and malfunctions, is disclosed. The method may include receiving aircraft systems data from one or more aircraft systems, identifying any problems or malfunctions in the aircraft systems, automatically communicating any identified problems or malfunctions in the aircraft systems to the remote aircraft system data communications unit, receiving information concerning a solution to the identified problems or malfunctions in the aircraft systems from the remote aircraft system data communications unit, and implementing the solution to the identified problems or malfunctions in the aircraft systems.

BRIEF DESCRIPTION OF THE DRAWINGS

In order to describe the manner in which the above-recited and other advantages and features of the disclosure can be obtained, a more particular description of the disclosure briefly described above will be rendered by reference to specific embodiments thereof which are illustrated in the appended drawings. Understanding that these drawings depict only typical embodiments of the disclosure and are not therefore to be considered to be limiting of its scope, the disclosure will be described and explained with additional specificity and detail through the use of the accompanying drawings in which.

DESCRIPTION OF THE DISCLOSED EMBODIMENTS

Figure 1:
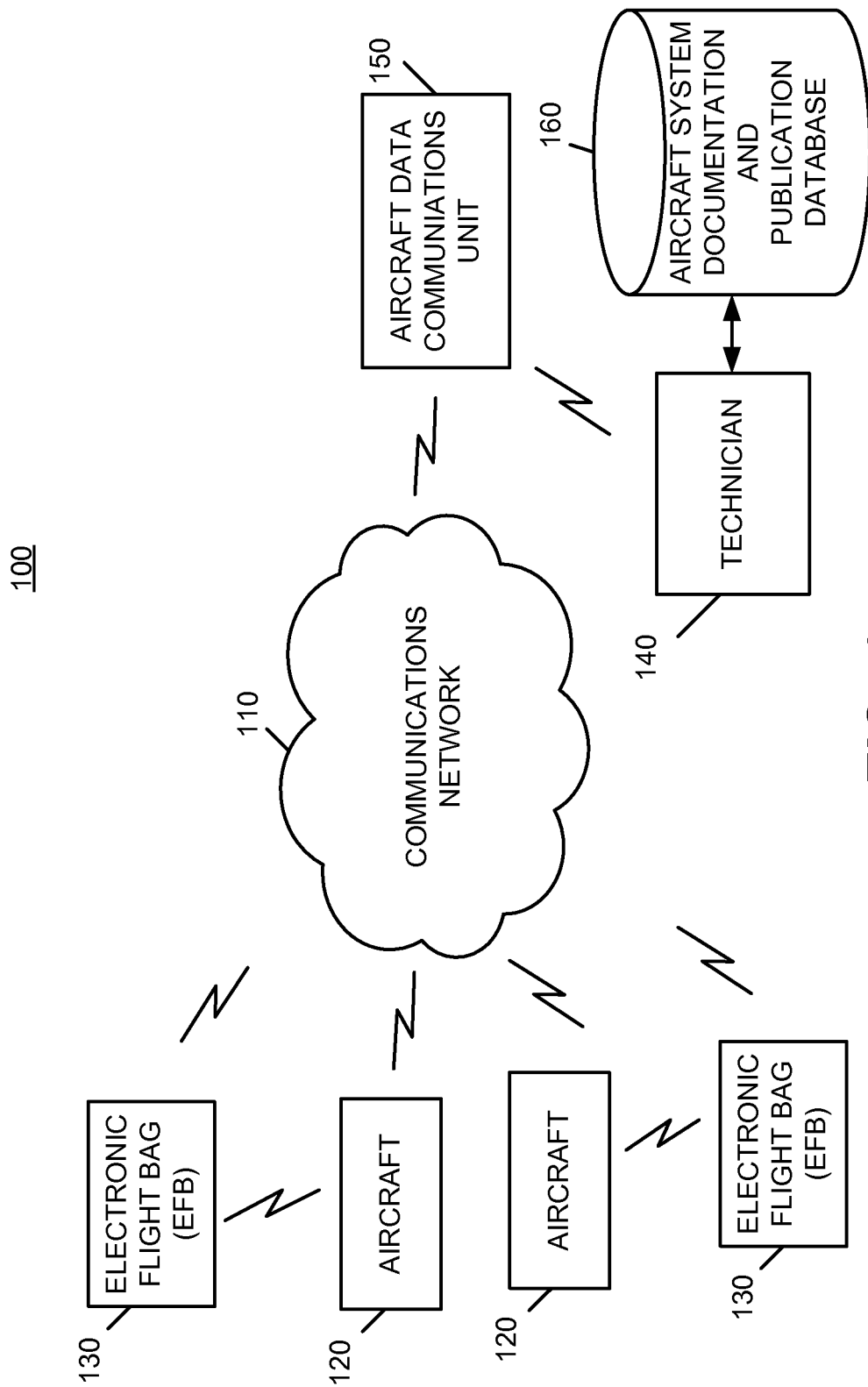
FIG. 1 is diagram of an exemplary aircraft solution management environment in accordance with a possible embodiment of the disclosure.

Additional features and advantages of the disclosed embodiments will be set forth in the description which follows, and in part will be obvious from the description, or may be learned by practice of the disclosed embodiments. The features and advantages of the disclosed embodiments may be realized and obtained by means of the instruments and combinations particularly pointed out in the appended claims. These and other features of the present disclosed embodiments will become more fully apparent from the following description and appended claims, or may be learned by the practice of the disclosed embodiments as set forth herein.

Various embodiments of the disclosed embodiments are discussed in detail below. While specific implementations are discussed, it should be understood that this is done for illustration purposes only. A person skilled in the relevant art will recognize that other components and configurations may be used without parting from the spirit and scope of the disclosed embodiments.

The disclosed embodiments comprise a variety of embodiments, such as a method and apparatus and other embodiments that relate to the basic concepts of the disclosed embodiments. Note that while this disclosure discusses aircraft and airline uses for the disclosed embodiments, the disclosed embodiments by no means are limited to that technology area and may be applied to a wide variety of environments and uses.

The adoption of information technology (IT) within the airline industry has been increasing for their maintenance, engineering, and flight operations organizations. This use of IT to integrate into the aircraft platform is called "e-Enabling." There are a number of benefits to e-Enabling aircraft including greater efficiency and improved airline operations. One of the key additions to any e-Enabled architecture is the incorporation of Electronic Flight Bag (EFB) computers to provide additional information and informational displays to the aircraft.

The introduction of an EFB into commercial aircraft presents some benefits to maintain avionics equipment. In particular, EFBs can provide a diagnostic capability that can help identify problems and potentially resolve some issues. The myriad of communications options within the EFB architecture allow for the remote monitoring of these diagnostics and for additional troubleshooting of hardware on the aircraft.

In addition, the EFB equipment itself must be maintained so that the EFB system availability is maintained. In this manner, if a component of the EFB system is faulty, it can be more easily identified and repaired or replaced.

The concept of a real time connected aircraft may provide a unique capability to provide almost instantaneous status of aircraft systems. This connectivity and capability may also allow these additional diagnostics to be performed which will greatly improve the aircraft availability.

The disclosed embodiments may also concern connecting the EFB over a variety of communications medium and perform actions on the EFB related to the avionics equipment as well as the EFB system itself. This process can be performed while the aircraft is sitting at the gate or if it were airborne. The functionality of an Electronic Flight Bag (EFB) computer on the aircraft may be used to initiate, monitor and disseminate information about other avionics on the aircraft connected via aircraft data busses. The EFB can connect to the aircraft's data busses, for example (such as ARINC 429, ARINC 717, Mil-Std-1553 or aircraft discrete signals). Many aircraft systems incorporate testing routines, such as Built in Test (BIT), which can be run periodically or on startup. These BIT results are uniformly available on aircraft data busses. The EFB can monitor transmit these data busses for information on aircraft systems operation and performance as well as other cabin systems and provide information on these data remotely from the aircraft via one of the networks installed on the aircraft. The EFB may also initiate diagnostics on other aircraft systems that are connected to the data busses. Full assurance may be provided so that security and integrity of those aircraft systems that are connected may not be compromised.

Remote diagnostics may be extended by developing or adapting diagnostic software that would reside on the EFB. A separate companion program would be run off of the ground component of the EFB system that would receive the results of these diagnostics and provide advice as to a remedy or a necessary corrective action. These diagnostics would encompass system or unit availability and operations, including connectivity and throughput. The diagnostics may be initiated manually on the aircraft or there could be automated diagnostics that could be triggered upon the existence of an issue.

Conventional aircraft systems equipment have had the capability initiating these types of diagnostics since additional processing necessary to initiate these types of diagnostics on-aircraft were not available. In addition, the lack of a suitable data link connection, such as is employed with an EFB has always been another impediment to the implementation of such a capability.

The disclosed embodiments may also allow the aircraft to remotely process and facilitate administration and configuration updates. This process may allow maintenance technicians to monitor systems performance on the ground and resolve problems on-board in real time. Common configuration issues or hardware anomalies can be identified in the conditions in which they are occurring as sometimes these issues cannot be duplicated in a ground test environment.

According to the disclosed embodiments, the EFB may function as an additional processing element to provide this remote diagnostic capability and may be installed in the aircraft as a Class 2 or Class 3 EFB. A Class 2 EFB may be considered as a situation where the equipment is considered installed but must be portable and removable without special tooling. A Class 3 EFB may be considered as a situation where equipment is permanently installed in the aircraft and is under design review. A Class 2 or Class 3 EFB may be installed under a Supplement Type Certificate (STC) or other airworthiness approval process. The real time information and diagnostics is a capability that could not be realized until a system, such as an EFB was incorporated into the aircraft platform.

FIG. 1 is diagram of an exemplary aircraft solution management environment 100 in accordance with a possible embodiment of the disclosure. The aircraft solution management environment 100 may include one or more aircraft 120 each having one or more Electronic Flight Bags (EFBs) 130, and an aircraft data communications unit 150 connected to the communications network 110. The aircraft data communications unit 150 may include access to one or more aircraft system documentation and publication databases 160 and may be in communication with one or more aircraft system technicians 140. Although the connections in FIG. 1 are shown as a wireless configuration, one or more of these connections may also be wired.

Communications network 110 may represent any communications network used to communicate with other entities, including the Internet, an intranet, a radio network, a wireless network, etc. Note that a hub, router, switch, server, computer, or any other device that may serve as an intermediate communication routing device between the communications network 110 and the aircraft 120 (or EFB 130) or the aircraft data communications unit 150.

The aircraft data communications unit 150 may be any server, computer, processing device, personal digital assistant (PDA), or other similar device capable of storing and managing media publications and other documents and products. The one or more aircraft system documentation and publication databases 160 may serve to store messages, video, audio, and up-to-date aircraft publications, including aircraft-type or aircraft-system publications, safety-of-flight documentation, schematics, troubleshooting documentation, charts, and other materials, etc. known to one of skill in the art. The one or more technicians 140 may have access to the aircraft system documentation and publication database 160, as required. The one or more technicians 140 may be given aircraft system information concerning a particular aircraft's system problem or malfunction from the aircraft data communications unit 150, that may have been relayed to the aircraft data communications unit 150 from the aircraft's EFB 130. The problems or malfunction may concern the aircraft's EFB 130 itself, for example.

Figure 2:
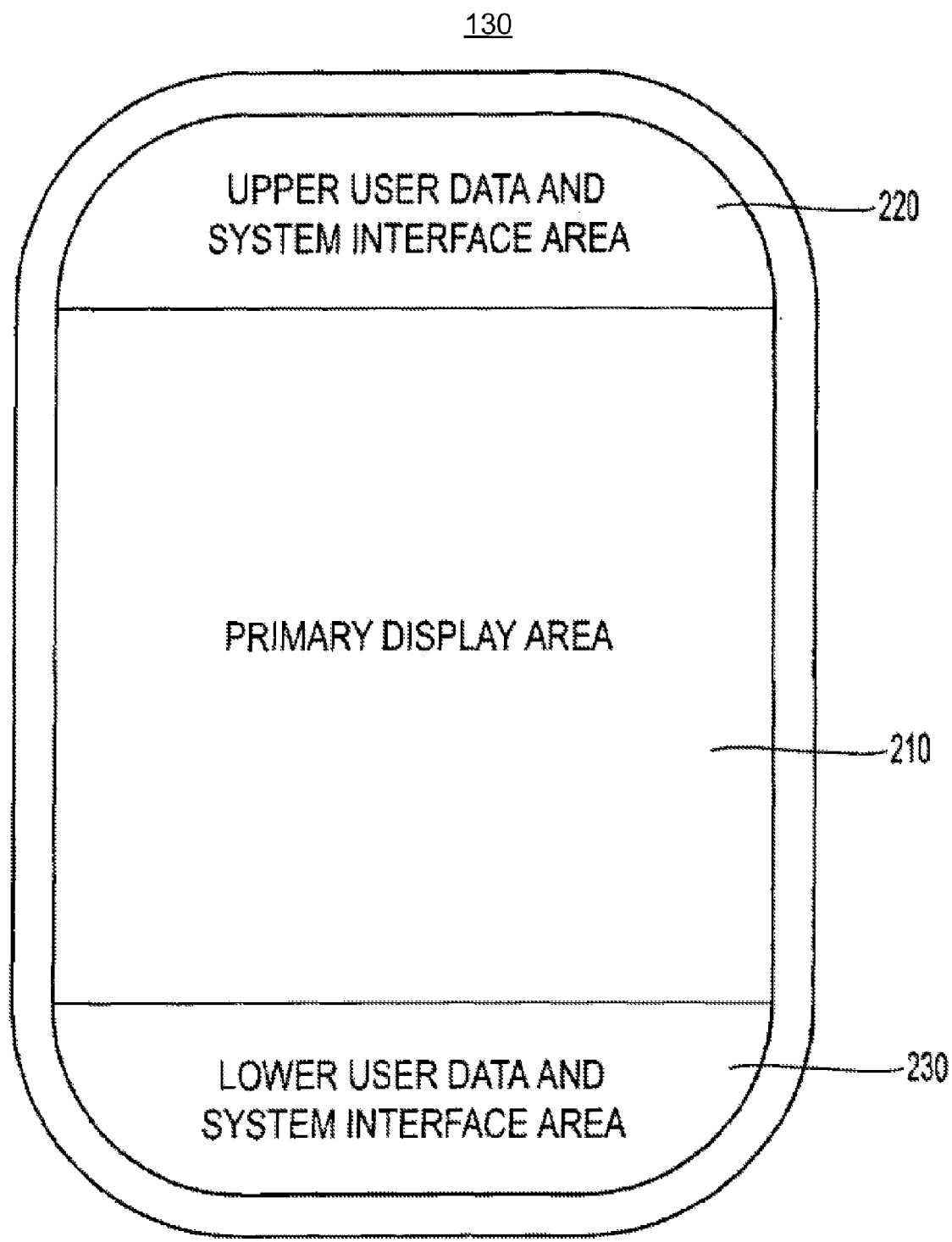
FIG. 2 is a diagram of an exemplary electronic flight bag in accordance with a possible embodiment of the disclosure.

FIG. 2 illustrates an exemplary embodiment of an EFB 130 in accordance with a possible embodiment of the disclosure. The exemplary EFB 130 may include a primary data display area 210, an upper user data and system interface area 220, and a lower user data and system interface area 230, for example. The upper and lower user data and system interface areas 220, 230, may be located in an exemplary manner in the top and bottom three quarters of an inch of the overall display area, may be ordinarily hidden and are dedicated to receive user input and present options to a user for manipulating the data to be displayed on the primary display area 210 of the EFB 130. These upper and lower user data and system interface areas 220, 230 may normally be hidden allowing the primary display area 210 to extend to the limits of the overall display area. The overall display area of the EFB 130 may be touched in either of the upper and lower user data and system interface areas 220, 230, to enable menu choices to be presented to the individual cockpit flight crew member facilitating manipulation and control of the data to be displayed on the EFB 130.

The primary display area 210, which, as noted above, may generally overlap the upper and lower user data and system interface areas 220, 230, and can be used to display any one of tens of thousands of static (e.g., text and still pictures), dynamic (e.g., video and/or audio), and/or interactive (e.g., checklists and forms) pages of data stored in the reference library of the EFB 130. Such pages of data displayed normally in the primary display area 210 include, for example, required checklists, aircraft operating manuals, navigation charts and/or publications and other like pages of reference materials required for operation and navigation of the aircraft under normal and emergency conditions. An individual cockpit flight crew member can simply review the information presented which is critical to the immediate phase of flight. Alternatively, in the case of checklists, these are often available in an interactive manner such that, as individual steps in the checklist are completed, the individual cockpit flight crew member can "check-off" the step in an interactive manner by manipulating the display of the EFB 130. The resulting indication for the "check-off" of the step can then be displayed not only on the EFB 130 of the individual cockpit flight crew member who verified accomplishment of the step, but the "check-off" indication can be immediately and coincidentally displayed on the EFBs of the other individual cockpit flight crew members who had the checklist up for display at that given time based on the interaction of the EFBs 130 and communication therebetween.

With respect to the disclosed embodiments, the EFB 130 may receive status updates and other system data from various aircraft systems while in the air and on the ground. The EFB 130 may also run an internal status or diagnostic check on itself to determine if any malfunctions or problems exist in the hardware or software implementations. If any problems exist in either the EFB 130 or other aircraft systems, those problems once identified may be sent through the communications network 110 to the aircraft data communications unit 150. An automated diagnostic unit or technician 140 may then review the problem and send a solution (e.g., electronic signal or written instructions) or troubleshooting instructions to the EFB 130 through the aircraft data communications unit 150 and the communications network 110. The problem may be automatically corrected via the electronic signal to the EFB 130 requiring no human intervention. The electronic signal may be relayed to another EFB 130 or to the malfunctioning aircraft system, for example. Otherwise, the pilot or aircrew may be given instructions via the EFB 130 on how to fix or further troubleshoot the problem.

Figure 3:
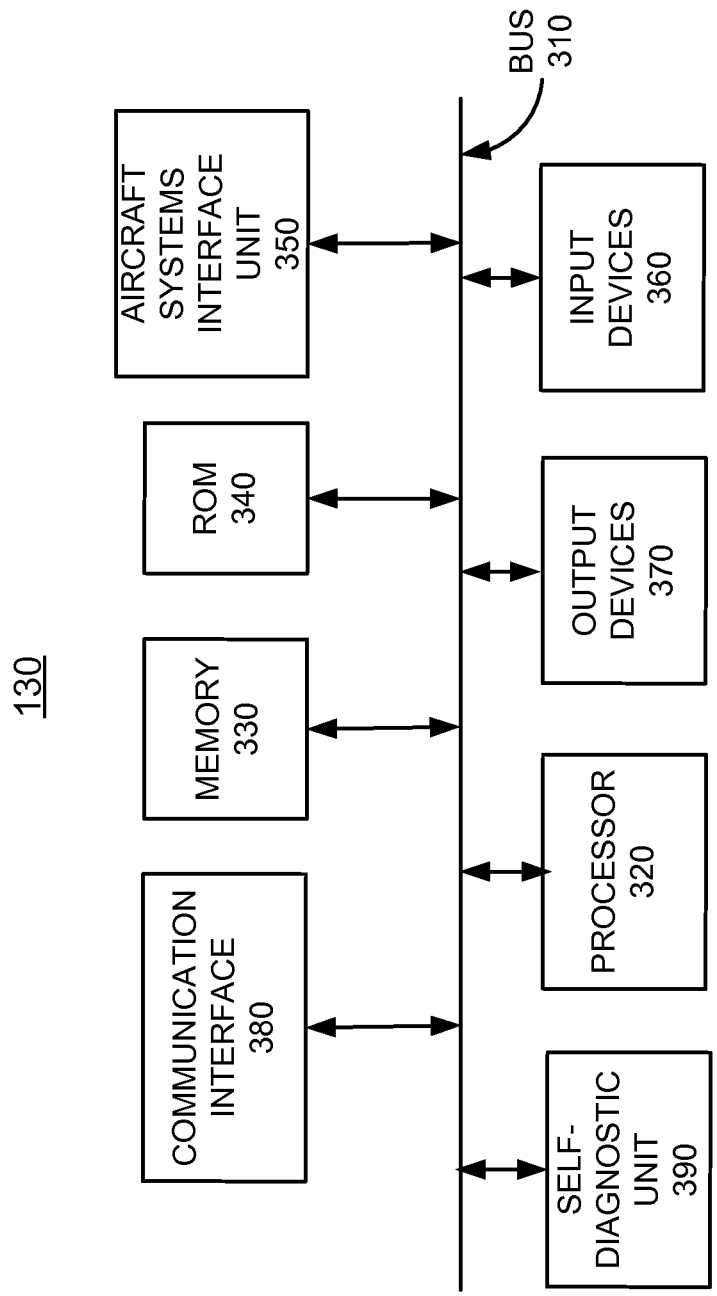
FIG. 3 is an exemplary block diagram of an electronic flight bag in accordance with a possible embodiment of the disclosure.

FIG. 3 is a block diagram of an exemplary EFB 130 in accordance with a possible embodiment of the disclosure. The exemplary EFB 130 may include bus 310, processor 320, memory 330, read only memory (ROM) 340, aircraft systems interface unit 350, input devices 360, output devices 370, communication interface 380, and self-diagnostic unit 390. Bus 310 may permit communication among the components of the EFB 130.

Processor 320 may include at least one conventional processor or microprocessor that interprets and executes instructions. Memory 330 may be a random access memory (RAM) or another type of dynamic storage device that stores information and instructions for execution by processor 320. Memory 330 may also store temporary variables or other intermediate information used during execution of instructions by processor 320. ROM 340 may include a conventional ROM device or another type of static storage device that stores static information and instructions for processor 320. Memory 330 may also represent any storage device that may include any type of media, such as, for example, magnetic or optical recording media and its corresponding drive.

Input devices 360 may include one or more conventional mechanisms that permit a user to input information to the EFB 130, such as a keyboard, a mouse, a pen, a voice recognition device, etc. Output devices 370 may include one or more conventional mechanisms that output information to the user, including a display, a printer, one or more speakers, or a medium, such as a memory, or a magnetic or optical disk and a corresponding disk drive.

Communication interface 380 may include any transceiver-like mechanism that enables the EFB 130 to communicate via a network. For example, communication interface 380 may include a modem, or an Ethernet interface for communicating via a local area network (LAN). Alternatively, communication interface 380 may include other mechanisms for communicating with other devices and/or systems via wired, wireless or optical connections. In some implementations of the EFB 130, communication interface 380 may not be included in the exemplary EFB 130 when the content management process is implemented completely within the EFB 130.

The self-diagnostic unit 390 may serve to automatically run diagnostic checks on the EFB 130 systems and determine if any problems or malfunctions exist in the EFB 130. The self-diagnostic unit 390 may provide solutions to EFB 130 malfunctions and problems or send the information to a remote aircraft data communications unit 150, for example.

The EFB 130 may perform such functions in response to processor 320 by executing sequences of instructions contained in a computer-readable medium, such as, for example, memory 330, a magnetic disk, or an optical disk. Such instructions may be read into memory 330 from another computer-readable medium, such as a storage device, or from a separate device via communication interface 380.

Figure 4:
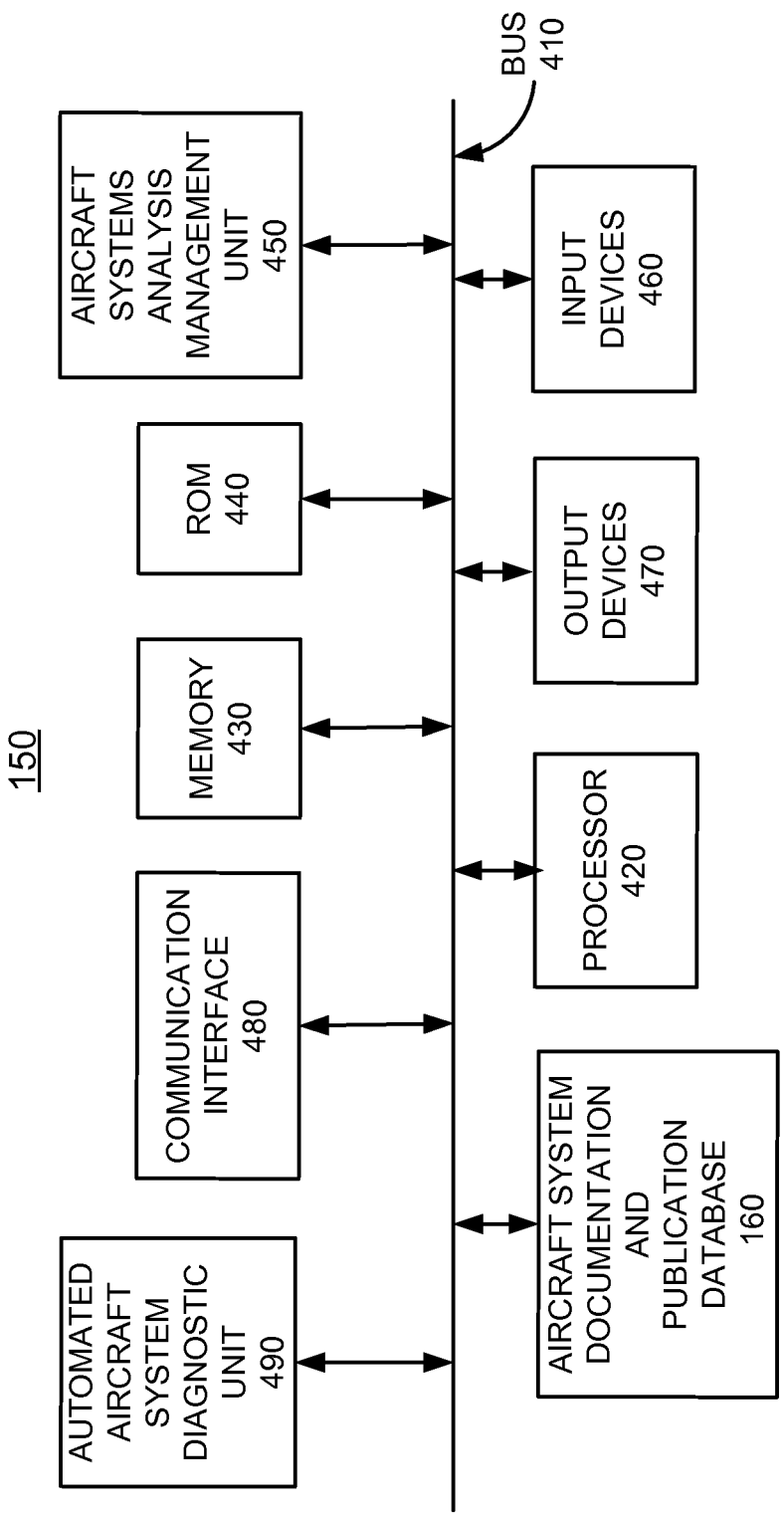
FIG. 4 is an exemplary block diagram of an aircraft data communications unit in accordance with a possible embodiment of the disclosure.

FIG. 4 is an exemplary block diagram of an aircraft data communications unit 150 in accordance with a possible embodiment of the disclosure. The exemplary aircraft data communications unit 150 may include bus 410, processor 420, memory 430, read only memory (ROM) 440, aircraft systems analysis management unit 450, input devices 460, output devices 470, communication interface 480, automated aircraft system diagnostic unit 490, and one or more aircraft system documentation and publication databases 160. Bus 410 may permit communication among the components of the aircraft data communications unit 150.

Processor 420 may include at least one conventional processor or microprocessor that interprets and executes instructions. Memory 430 may be a random access memory (RAM) or another type of dynamic storage device that stores information and instructions for execution by processor 420. Memory 430 may also store temporary variables or other intermediate information used during execution of instructions by processor 420. ROM 440 may include a conventional ROM device or another type of static storage device that stores static information and instructions for processor 420. Memory 430 may also represent any storage device that may include any type of media, such as, for example, magnetic or optical recording media and its corresponding drive.

Input devices 460 may include one or more conventional mechanisms that permit a user to input information to the aircraft data communications unit 150, such as a keyboard, a mouse, a pen, a voice recognition device, etc. Output devices 470 may include one or more conventional mechanisms that output information to the user, including a display, a printer, one or more speakers, or a medium, such as a memory, or a magnetic or optical disk and a corresponding disk drive.

Communication interface 480 may include any transceiver-like mechanism that enables the aircraft data communications unit 150 to communicate via a network. For example, communication interface 480 may include a modem, or an Ethernet interface for communicating via a local area network (LAN). Alternatively, communication interface 480 may include other mechanisms for communicating with other devices and/or systems via wired, wireless or optical connections. In some implementations of the aircraft data communications unit 150, communication interface 480 may not be included in the exemplary aircraft data communications unit 150 when the content management process is implemented completely within the aircraft data communications unit 150.

The automated aircraft system diagnostic unit 490 may serve to automatically run diagnostic checks on the EFB 130 or other aircraft systems remotely in an attempt to diagnose and solve a problem or malfunction. The automated aircraft system diagnostic unit 490 may use look-up tables, databases, etc. to assist in the diagnostic process. The automated aircraft system diagnostic unit 490 may automatically send the diagnostic or solution information to the aircraft's EFB 130 via the remote aircraft data communications unit 150, for example. The automated aircraft system diagnostic unit 490 may also assist the technician 140 by providing him or her information need to resolve the aircraft system or EFB 130 problem.

The one or more aircraft system documentation and publication databases 160 may serve to store messages, video, audio, and up-to-date aircraft publications, including aircraft-type or aircraft-system publications, safety-of-flight documentation, schematics, troubleshooting documentation, charts, and other materials, etc. known to one of skill in the art. Note that the one or more aircraft system documentation and publication databases 160 may be stored in the memory 430, for example.

The aircraft data communications unit 150 may perform such functions in response to processor 420 by executing sequences of instructions contained in a computer-readable medium, such as, for example, memory 430, a magnetic disk, or an optical disk. Such instructions may be read into memory 430 from another computer-readable medium, such as a storage device, or from a separate device via communication interface 480.

The aircraft solution management environment 100, the EFB 130, and the aircraft data communications unit 150 illustrated in FIGS. 1-4 and the related discussion are intended to provide a brief, general description of a suitable computing environment in which the disclosure may be implemented. Although not required, the disclosure will be described, at least in part, in the general context of computer-executable instructions, such as program modules, being executed by the EFB 130 and the aircraft data communications unit 150, such as a general purpose computer. Generally, program modules include routine programs, objects, components, data structures, etc. that perform particular tasks or implement particular abstract data types. Moreover, those skilled in the art will appreciate that other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like.

Embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

For illustrative purposes, the operation of the aircraft systems interface unit 350 and the aircraft systems analysis management unit 450 will be described in the flowcharts below in FIGS. 5 and 6, respectively, in relation to the diagrams shown in FIGS. 1-4.

Figure 5:
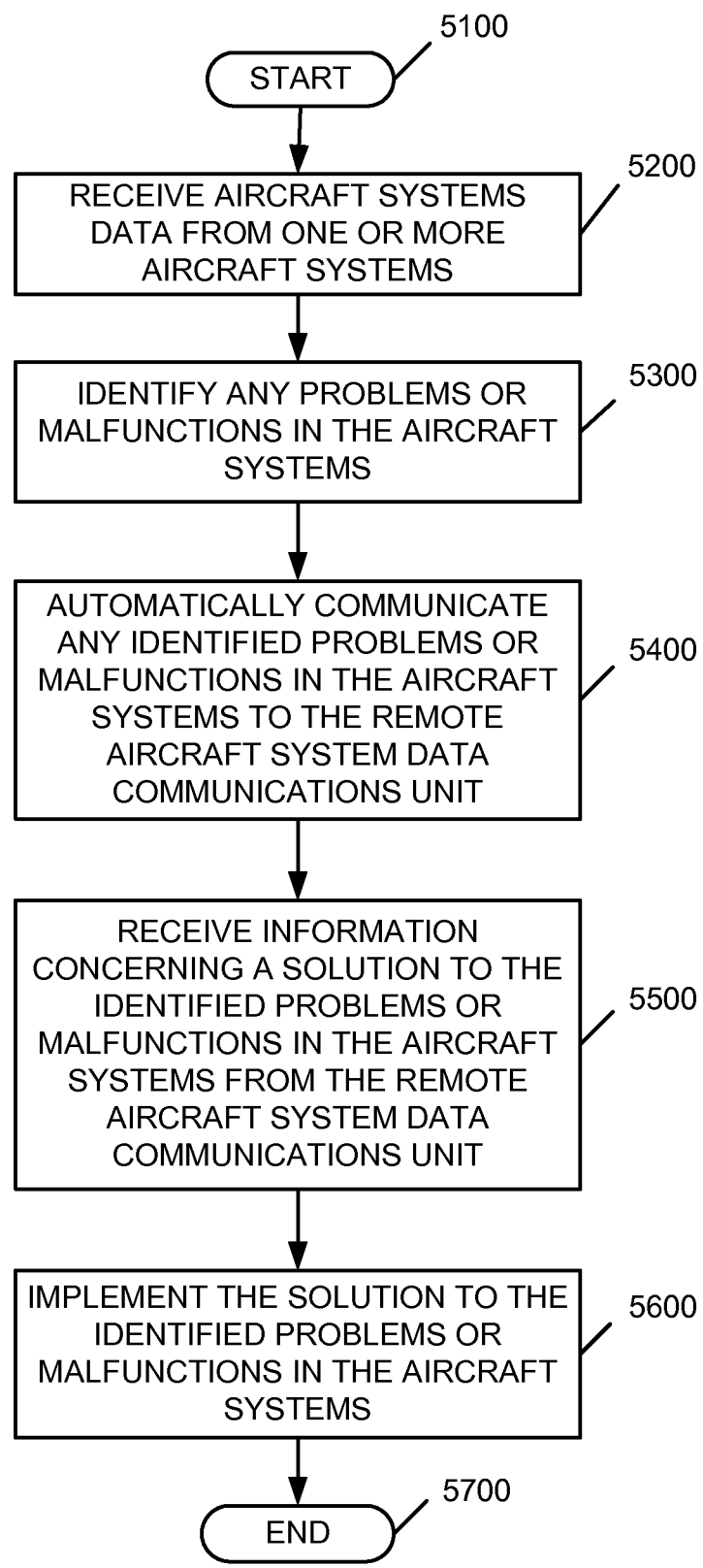
FIG. 5 is an exemplary flowchart illustrating one possible aircraft system data interface process in accordance with one possible embodiment of the disclosure.
Figure 6:
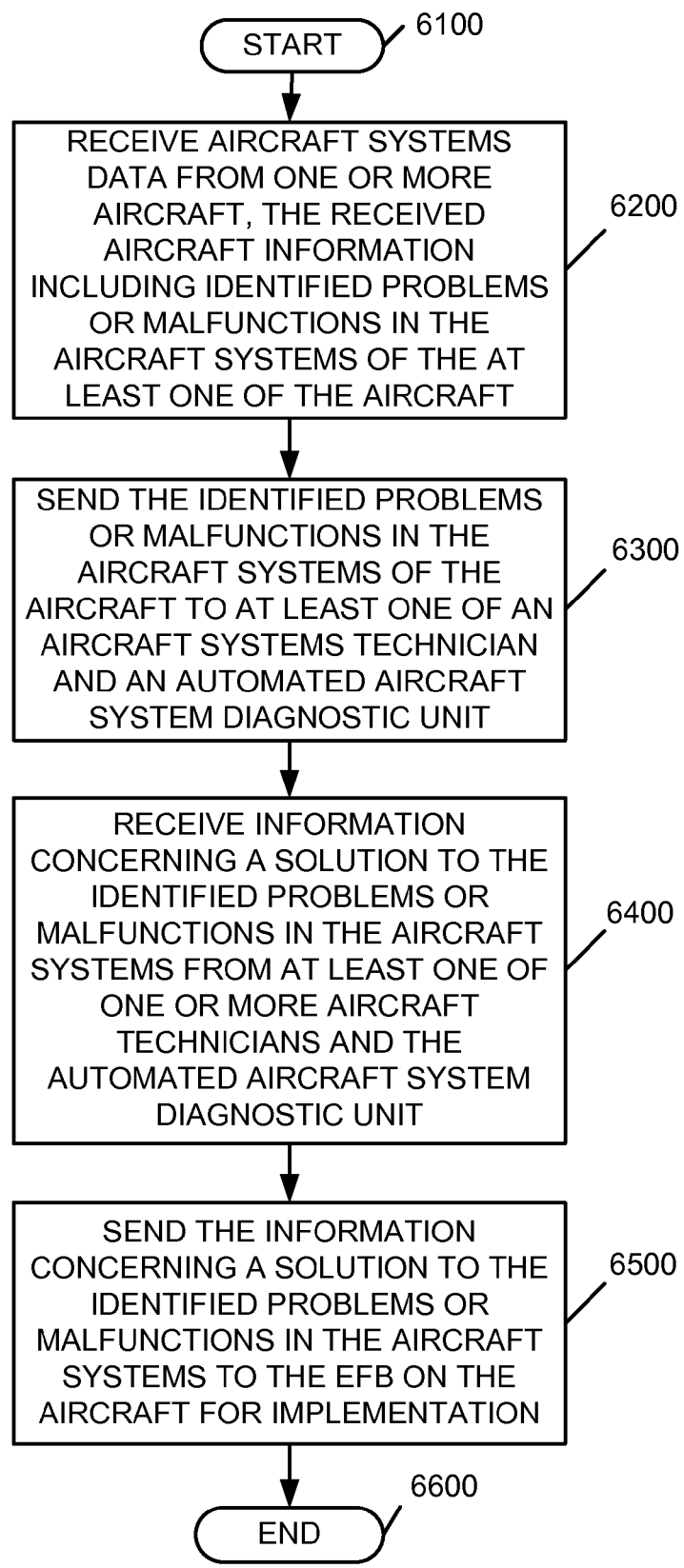
FIG. 6 is an exemplary flowchart illustrating one possible aircraft analysis management process in accordance with one possible embodiment of the disclosure.

FIG. 5 is an exemplary flowchart illustrating one possible aircraft system data interface process in accordance with one possible embodiment of the disclosure. The process may begin at step 5100 and may continue to step 5200 where the aircraft systems interface unit 350 may receive aircraft systems data from one or more aircraft systems. At step 5300, the aircraft systems interface unit 350 may identify any problems or malfunctions in the aircraft systems.

At step 5400, the aircraft systems interface unit 350 may automatically communicate any identified problems or malfunctions in the aircraft systems to the remote aircraft system data communications unit 150 through the communication interface 380. At step 5500, the aircraft systems interface unit 350 may receive information concerning a solution to the identified problems or malfunctions in the aircraft systems from the remote aircraft system data communications unit 150 through the communication interface 380. At step 5600, the aircraft systems interface unit 350 may implement the solution to the identified problems or malfunctions in the aircraft systems. The process may then go to step 5700 and end.

Implementing the solution to the identified problems or malfunctions in the aircraft systems may include outputting the solution to at least one of the aircraft's pilot and crewmembers, or automatically implementing the solution to the identified problems or malfunctions in the aircraft systems. The one or more aircraft systems may include the EFB and any problems or malfunctions in the EFB may be identified by a self-diagnostic check FIG. 6 is an exemplary flowchart illustrating one possible aircraft analysis management process in accordance with one possible embodiment of the disclosure. The process may begin at step 6100 and may continue to step 6200 where the aircraft systems analysis management unit 450 may receive aircraft systems data from one or more aircraft 120 through the communication interface 480. The received aircraft information may include identified problems or malfunctions in the aircraft systems of the at least one of the aircraft 130. At step 6300, the aircraft systems analysis management unit 450 may send the identified problems or malfunctions in the aircraft systems of the aircraft 120 to at least one of an aircraft systems technician 140 and an automated aircraft system diagnostic unit 490.

At step 6400, the aircraft systems analysis management unit 450 may receive information concerning a solution to the identified problems or malfunctions in the aircraft systems from at least one of one or more aircraft technicians 140 and the automated aircraft system diagnostic unit 490. At step 6500, the aircraft systems analysis management unit 450 may send the information concerning a solution to the identified problems or malfunctions in the aircraft systems to the EFB 130 on the aircraft for implementation through the communication interface 480. The process may then go to step 6600 and end.

Embodiments within the scope of the present disclosed embodiments may also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, objects, components, and data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Although the above description may contain specific details, they should not be construed as limiting the claims in any way. Other configurations are part of the scope of the disclosed embodiments. For example, the principles of the disclosed embodiments may be applied to each individual user where each user may individually deploy such a system. This enables each user to utilize the benefits of the disclosed embodiments even if any one of the large number of possible applications do not need the functionality described herein. In other words, there may be multiple instances of the disclosed system each processing the content in various possible ways. It does not necessarily need to be one system used by all end users. Accordingly, the appended claims and their legal equivalents should only define the disclosed embodiments, rather than any specific examples given.

What is claimed is:

1. A method for using an Electronic Flight Bag (EFB) located on an aircraft to communicate with a remote aircraft system data communications unit on the ground concerning aircraft systems problems and malfunctions while the aircraft is in flight, comprising:
   receiving, with a processor in an EFB, aircraft systems data from one or more aircraft systems while the aircraft is in flight;
   identifying, with the processor in the EFB, problems or malfunctions in the one or more aircraft systems while the aircraft is in flight;
   automatically communicating, from the processor in the EFB, identified problems or malfunctions in the one or more aircraft systems to the remote aircraft system data communications unit located on the ground in real time;
   receiving, with the processor in the EFB, information concerning a solution to the identified problems or malfunctions in the one or more aircraft systems from the remote aircraft system data communications unit located on the ground in substantially real time; and
   implementing, with the processor in the EFB, the solution to the identified problems or malfunctions in the one or more aircraft systems while the aircraft is in flight.

2. The method of claim 1, the implementing of the solution to the identified problems or malfunctions in the one or more aircraft systems including outputting the solution to at least one of a pilot and crewmembers of the aircraft from the EFB.

3. The method of claim 1, the implementing of the solution to the identified problems or malfunctions in the one or more aircraft systems including automatically implementing the solution to the identified problems or malfunctions in the one or more aircraft systems with the processor in the EFB.

4. The method of claim 2, the outputting the solution to the at least one of the pilot and crewmembers of the aircraft comprising displaying the solution on a display screen of the EFB.

5. An Electronic Flight Bag (EFB) located on an aircraft to communicate with a remote aircraft system data communications unit on the ground concerning aircraft systems problems and malfunctions while the aircraft is in flight, comprising:
   a communication interface; and
   an aircraft systems interface unit in the EFB that is configured to
      receive aircraft systems data from one or more aircraft systems with the EFB while the aircraft is in flight,
      identify problems or malfunctions in the one or more aircraft systems with the EFB while the aircraft is in flight,
      automatically communicate the identified problems or malfunctions in the one or more aircraft systems from the EFB to the remote aircraft system data communications unit on the ground through the communication interface in real time,
      receive information concerning a solution to the identified problems or malfunctions in the one or more aircraft systems from the remote aircraft system data communications unit on the ground through the communication interface in the EFB in substantially real time while the aircraft is in flight, and
      implement, via a processor in the EFB, the solution to the identified problems or malfunctions in the one or more aircraft systems while the aircraft is in flight.

6. The EFB of claim 5, the aircraft systems interface unit implementing the solution to the identified problems or malfunctions in the one or more aircraft systems by outputting the solution to at least one of pilot and crewmembers of the aircraft from the EFB.

7. The EFB of claim 5, the aircraft systems interface unit implementing the solution to the identified problems or malfunctions in the one or more aircraft systems by automatically implementing the solution to the identified problems or malfunctions in the one or more aircraft systems with the processor in the EFB.

8. The EFB of claim 6, the outputting the solution to the at least one of the pilot and crewmembers of the aircraft comprising displaying the solution on a display screen of the EFB.

9. A method for using a remote aircraft system data communications unit on the ground to communicate with an Electronic Flight Bag (EFB) located on an aircraft concerning aircraft systems problems and malfunctions while the aircraft is in flight, comprising:
   receiving, with a processor in a remote aircraft system data communications unit on the ground in real time, aircraft systems data from an EFB located on the aircraft, the received aircraft information including identified problems or malfunctions in the aircraft systems of the aircraft in flight, as determined by the EFB;
   sending information on the identified problems or malfunctions in the aircraft systems of the aircraft in flight, received from the EFB, from the remote aircraft system data communications unit on the ground to at least one of an aircraft systems technician and an automated aircraft system diagnostic unit associated with the remote aircraft system data communications unit on the ground;

receiving, with the processor in the remote aircraft system data communications unit on the ground, information concerning a solution to the identified problems or malfunctions in the aircraft systems in flight from the at least one of the aircraft systems technician and the automated aircraft system diagnostic unit on the ground; and sending the information concerning the solution to the identified problems or malfunctions in the aircraft systems from the remote aircraft system data communications unit on the ground to the EFB located on the aircraft in substantially real time for implementation of the solution by a processor in the EFB while the aircraft is in flight.

10. The method of claim 9, the implementation of the solution to the identified problems or malfunctions in the aircraft systems including outputting the solution to at least one of pilot and crewmembers of the aircraft from the EFB.

11. The method of claim 9, the implementation of the solution to the identified problems or malfunctions in the aircraft systems including automatically implementing the solution to the identified problems or malfunctions in the aircraft systems with the processor in the EFB.

12. The method of claim 10, the outputting the solution to the at least one of the pilot and crewmembers of the aircraft comprising displaying the solution on a display screen of the EFB.

13. An aircraft data communications unit that communicates with an Electronic Flight Bag (EFB) located on an aircraft concerning aircraft systems problems and malfunctions, comprising:

a communication interface;

an aircraft systems analysis management unit on the ground that is configured to receive aircraft systems data from an EFB located on the aircraft while the aircraft is in flight in real time through the communication interface, the received aircraft information including identified problems or malfunctions in the aircraft systems of the aircraft, as determined by a processor in the EFB while the aircraft is in flight, send the identified problems or malfunctions in the aircraft systems of the aircraft in flight to at least one of an aircraft systems technician and an automated aircraft system diagnostic unit on the ground, receive information concerning a solution to the identified problems or malfunctions in the aircraft systems from the at least one of the aircraft systems technician and the automated aircraft system diagnostic unit on the ground, and send the information concerning the solution to the identified problems or malfunctions in the aircraft systems to the EFB located on the aircraft in substantially real time for implementation with the processor in the EFB while the aircraft is in flight through the communication interface.

14. The aircraft data communications unit of claim 13, the implementation of the solution to the identified problems or malfunctions in the aircraft systems including outputting the solution to at least one of a pilot and crewmembers of the aircraft from the EFB.

15. The aircraft data communications unit of claim 13, the implementation of the solution to the identified problems or malfunctions in the aircraft systems including automatically implementing the solution to the identified problems or malfunctions in the aircraft systems via the with the processor in the EFB.

16. The aircraft data communications unit of claim 14, the outputting the solution to the at least one of the pilot and crewmembers of the aircraft comprising displaying the solution on a display screen of the EFB.

* * * * *